(12) United States Patent
Oh et al.

(10) Patent No.: US 10,622,428 B2
(45) Date of Patent: Apr. 14, 2020

(54) BACKPLANE SUBSTRATE, METHOD OF MANUFACTURING THE SAME, AND ORGANIC LIGHT-EMITTING DISPLAY DEVICE USING THE SAME

(71) Applicant: LG Display Co., Ltd., Seoul (KR)

(72) Inventors: Kum-Mi Oh, Seoul (KR); Shun-Young Yang, Bucheon-si (KR); Min-Seong Yun, Namyangju-si (KR)

(73) Assignee: LG Display Co., Ltd., Seoul (KR)

( * ) Notice: Subject to any disclaimer, the term of this patent is extended or adjusted under 35 U.S.C. 154(b) by 11 days.

(21) Appl. No.: 15/855,993

(22) Filed: Dec. 27, 2017

(65) Prior Publication Data

US 2018/0190744 A1 Jul. 5, 2018

(30) Foreign Application Priority Data

Dec. 30, 2016 (KR) ........................ 10-2016-0184420

(51) Int. Cl.
| | |
|---|---|
| *H01L 27/32* | (2006.01) |
| *H01L 29/786* | (2006.01) |
| *H01L 29/66* | (2006.01) |
| *H01L 27/12* | (2006.01) |

(52) U.S. Cl.
CPC ........ *H01L 27/3262* (2013.01); *H01L 27/124* (2013.01); *H01L 27/127* (2013.01); *H01L 27/1255* (2013.01); *H01L 27/3211* (2013.01); *H01L 27/3248* (2013.01); *H01L 27/3276* (2013.01); *H01L 29/66765* (2013.01); *H01L 29/78678* (2013.01); *H01L 27/1222* (2013.01); *H01L 27/1262* (2013.01); *H01L 27/3265* (2013.01); *H01L 2227/323* (2013.01)

(58) Field of Classification Search
CPC ............... H01L 27/3262; H01L 27/127; H01L 29/66757; H01L 29/66765
See application file for complete search history.

(56) References Cited

U.S. PATENT DOCUMENTS

| | | | | | |
|---|---|---|---|---|---|
| 5,923,961 | A | * | 7/1999 | Shibuya | G02F 1/13454 438/149 |
| 9,276,050 | B2 | * | 3/2016 | Kwon | H01L 27/3262 |
| 2002/0014628 | A1 | * | 2/2002 | Koyama | G09G 3/30 257/72 |
| 2002/0140364 | A1 | * | 10/2002 | Inukai | G09G 3/2074 315/169.3 |
| 2017/0062545 | A1 | * | 3/2017 | Oh | H01L 27/3276 |
| 2017/0294497 | A1 | * | 10/2017 | Lius | H01L 27/1255 |
| 2018/0006102 | A1 | * | 1/2018 | Oh | H01L 27/3262 |

* cited by examiner

*Primary Examiner* — Thao X Le
*Assistant Examiner* — Gardner W. S. Swan
(74) *Attorney, Agent, or Firm* — Polsinelli PC

(57) ABSTRACT

Disclosed are a backplane substrate that is capable of expressing high gradation even through a small pixel, a method of manufacturing the same, and an organic light-emitting display device using the same. Integration for ultra-high resolution is possible through structural modification.

20 Claims, 16 Drawing Sheets

BACKPLANE SUBSTRATE, METHOD OF MANUFACTURING THE SAME, AND ORGANIC LIGHT-EMITTING DISPLAY DEVICE USING THE SAME

CROSS-REFERENCE TO RELATED APPLICATION

This application claims the benefit of Korean Patent Application No. 2016-0184420, filed on Dec. 30, 2016, which is hereby incorporated by reference in its entirety as if fully set forth herein.

BACKGROUND

Field of the Disclosure

The present disclosure relates to a display device, and more particularly to a backplane substrate that can be integrated for ultra-high resolution and expressing high gradation even through a small pixel, a method of manufacturing the same, and an organic light-emitting display device using the same.

Description of the Background

With the development of various kinds of portable electronic devices, such as mobile terminals and laptop computers, demand for flat panel display devices that are applicable thereto has increased.

Research has been conducted on flat panel display devices such as a liquid crystal display device, a plasma display panel device, a field emission display device, and an organic or inorganic light-emitting display device. In particular, the number of fields in which the organic light-emitting display device can be used has increased, since the organic light-emitting display device can be mass-produced, can be easily driven, consumes less power, can realize high quality and large size, and is flexible.

A flat panel display device includes a plurality of pixels arranged in the form of a matrix and at least one thin-film transistor provided in each pixel for controlling the pixel. Each pixel may include an R-subpixel, a G-subpixel, and a B-subpixel for color expression.

In a display device that requires high resolution, such as in augmented reality or virtual reality, however, the size of each pixel becomes smaller, since high resolution needs to be achieved within the limited size of the display device. Additionally, in a display device having a light-emitting device for each subpixel, like an organic light-emitting display device, a circuit device including, at a minimum, 2 transistors and a capacitor (2T1C) must be included in each small subpixel in order to express selective gradation of each subpixel. In this case, the thin-film transistors have the same structure. Since the size of each subpixel is small, however, a driving thin-film transistor is saturated within a short time when a gate voltage is applied, although device characteristics, such as mobility of the thin-film transistors, are improved. As a result, various and sufficient expression of gradation becomes difficult to accomplish.

That is, the size of each subpixel is reduced for high resolution, and circuits for driving each subpixel are included in the limited area of each subpixel. In the case in which the driving thin-film transistor and the other thin-film transistor are provided so as to have the same stack structure, the response speed of the driving thin-film transistor is rapid, but sufficient expression of gradation is difficult.

In addition, since the switching thin-film transistor and the driving thin-film transistor having the same stack structure must be connected to each other, it is necessary to provide a connection pattern for connecting the transistors in a planar state. That is, an additional connection pattern is required in order to connect two or more transistors having the same stack structure to each other. However, circuit integration in each subpixel is limited by the provision of such a connection pattern, thereby it is difficult to achieve ultra-high resolution.

SUMMARY

Accordingly, the present disclosure is directed to a backplane substrate, a method of manufacturing the same, and an organic light-emitting display device using the same that substantially obviate one or more problems due to limitations and disadvantages of the related art.

In addition, the present disclosure is to provide a backplane substrate that is capable of being integrated for ultra-high resolution and expressing high gradation even through a small pixel, a method of manufacturing the same, and an organic light-emitting display device using the same.

Additional advantages and features of the disclosure will be set forth in part in the description which follows and in part will become apparent to those having ordinary skill in the art upon examination of the following, or may be learned from practice of the disclosure. Other advantages of the disclosure may be realized and attained by the structure particularly pointed out in the written description and claims hereof as well as the appended drawings.

In a backplane substrate according to the present disclosure, a method of manufacturing the same, and an organic light-emitting display device including the same, different transistors are vertically connected to each other in each subpixel, thereby achieving device integration.

In addition, a driving thin-film transistor has a bottom gate shape having an offset area, and a switching thin-film transistor has a top gate shape. The driving thin-film transistor and the switching thin-film transistor are different from each other in terms of construction and operation thereof. Even in an ultra-high resolution structure, the driving thin-film transistor is capable of expressing high gradation, and the switching thin-film transistor is capable of having circuit characteristics of high mobility.

To achieve these and other advantages and in accordance with the purpose of the disclosure, as embodied and broadly described herein, a backplane substrate includes a substrate having a plurality of subpixels, a driving thin-film transistor located at each subpixel, the driving thin-film transistor including a first gate electrode, a first active layer, a first source electrode and a first drain electrode connected to the opposite sides of the first active layer, and a first gate insulating film provided between the first active layer and the first gate electrode, and a switching thin-film transistor electrically connected to the driving thin-film transistor at each subpixel, the switching thin-film transistor including a second gate electrode, a second active layer, a second source electrode and a second drain electrode connected to the opposite sides of the second active layer, and a second gate insulating film provided between the second active layer and the second gate electrode.

The first active layer and the second active layer may be located on the same layer, the first gate electrode and the second gate electrode may be located on different layers, and the first active layer may have an offset area protruding from the edge of the first gate electrode by a predetermined width in a planar state and a first doped area that abuts the offset area and is spaced apart from the edge of the first gate electrode.

The second active layer may have a second doped area that abuts the edge of the second gate electrode in a planar state.

The first gate electrode may overlap the second active layer, and may be connected to the second source electrode.

The second source electrode may be connected to the first gate electrode in an overlapping region between the second active layer and the first gate electrode through the second active layer.

The backplane substrate may further include a first storage electrode that overlaps the first gate electrode.

The first storage electrode and the first gate electrode may constitute a storage capacitor.

The first doped area and the second doped area may be doped with the same dopant.

The backplane substrate may further include a first gate auxiliary electrode that overlaps the offset area on the same layer as the second gate electrode.

The second source electrode, which is connected to the first gate electrode, may have a planar portion on a layer different from the layer on which the second drain electrode is located.

A first contact hole between the planar portion of the second source electrode and the first gate electrode may have a larger depth than a second contact hole between the upper surface of the second drain electrode and the second active layer.

The backplane substrate may further include a first storage auxiliary electrode that is connected to the first storage electrode and overlaps the planar portion of the second source electrode.

The first and second active layers may be made of polysilicon, the first active layer may have a first channel that overlaps the first gate electrode, and the second active layer may have a second channel that overlaps the second gate electrode.

In another aspect of the present disclosure, a method of manufacturing a backplane substrate includes preparing a substrate having a plurality of subpixels, forming a first gate electrode at each subpixel, forming a first gate insulating film so as to cover the first gate electrode, forming first and second active layers, which are spaced apart from each other, on the first gate insulating film, forming a second gate insulating film so as to cover the first and second active layers, forming a second gate electrode, which overlaps the second active layer, and a first gate auxiliary electrode, which overlaps the first active layer and protrudes further than the first gate electrode, on the second gate insulating film, forming a first doped area in the first active layer and a second doped area in the second active layer using the second gate electrode and the first gate auxiliary electrode as masks, forming an interlayer insulating film so as to cover the second gate electrode and to have first to fourth contact holes, through which the opposite sides of the first and second active layers are exposed, and forming a first source electrode and a first drain electrode connected to the opposite sides of the first active layer through the first and second contact holes and a second source electrode and a second drain electrode connected to the opposite sides of the second active layer through the third and fourth contact holes.

The method may further include removing the first gate auxiliary electrode.

The first gate electrode may partially overlap the second active layer in a planar state.

The step of forming the third contact hole may include removing the second gate insulating film, the second active layer, and the first gate insulating film, which is under the second active layer, together with the interlayer insulating film in an overlapping region between the first gate electrode and the second active layer.

The interlayer insulating film may include a plurality of interlayer insulating films.

The third contact hole and the fourth contact hole may be formed in different processes, and the third contact hole may be formed by removing a larger number of interlayer insulating films than the fourth contact hole.

The method may further include forming a first storage electrode, which overlaps the first gate electrode, under the first gate electrode after the step of preparing the substrate.

The method may further include forming a first storage auxiliary electrode that is connected to the first storage electrode and overlaps a planar portion of the second source electrode.

In a further aspect of the present disclosure, an organic light-emitting display device includes the backplane substrate and an organic light-emitting diode including a first electrode connected to the first source electrode, an organic emissive layer located on the first electrode, and a second electrode located on the organic emissive layer at each subpixel.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Figure 1:
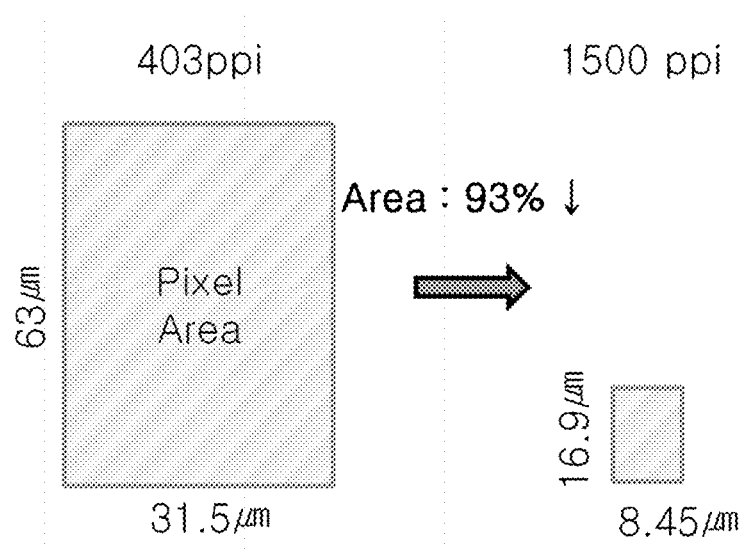
FIG. 1 is a conceptual view showing a change in the area of a subpixel depending on the change of resolution.

The advantages and features of the present disclosure and the way of attaining them will become apparent with reference to aspects described below in detail in conjunction with the accompanying drawings. The present disclosure, however, are not limited to the aspects disclosed hereinafter and may be embodied in many different forms. Rather, these exemplary aspects are provided so that this disclosure will be through and complete and will fully convey the scope to those skilled in the art. The scope of the present disclosure should be defined by the claims.

In the drawings for explaining the exemplary aspects of the present disclosure, for example, the illustrated shape, size, ratio, angle, and number are given by way of example, and thus, are not limited to the disclosure of the present disclosure. Throughout the present specification, the same reference numerals designate the same constituent elements. In addition, in the following description of the present disclosure, a detailed description of known functions and configurations incorporated herein will be omitted when it may make the subject matter of the present disclosure rather unclear. The terms "comprises," "includes," and/or "has", used in this specification, do not preclude the presence or addition of other elements unless it is used along with the term "only". The singular forms "a," "an," and "the" are intended to include the plural forms as well, unless the context clearly indicates otherwise.

In the interpretation of constituent elements included in the various aspects of the present disclosure, the constituent elements are interpreted as including an error range even if there is no explicit description thereof.

In the description of the various aspects of the present disclosure, when describing positional relationships, for example, when the positional relationship between two parts is described using "on", "above", "below", "aside", or the like, one or more other parts may be located between the two parts unless the term "directly" or "closely" is used.

In the description of the various aspects of the present disclosure, when describing temporal relationships, for example, when the temporal relationship between two actions is described using "after", "subsequently", "next", "before", or the like, the actions may not occur in succession unless the term "directly" or "just" is used.

In the description of the various aspects of the present disclosure, although terms such as, for example, "first" and "second" may be used to describe various elements, these terms are merely used to distinguish the same or similar elements from each other. Therefore, in the present specification, an element modified by "first" may be the same as an element modified by "second" within the technical scope of the present disclosure unless otherwise mentioned.

The respective features of the various aspects of the present disclosure may be partially or wholly coupled to and combined with each other, and various technical linkages and driving thereof are possible. These various aspects may be performed independently of each other, or may be performed in association with each other.

FIG. 1 is a conceptual view showing a change in the area of a subpixel depending on the change of resolution.

In a display device that requires high resolution, such as in augmented reality or virtual reality, as shown in FIG. 1, the size of each pixel becomes smaller, since high resolution needs to be achieved within the limited size of the display device. FIG. 1 shows an example in which resolution is increased from a resolution of 403 ppi in a full high-definition (FHD) structure to a resolution of 1500 ppi, which is ultra-high resolution. In the ultra-high resolution, the area of each subpixel is reduced to about 1/14 of that of the FHD structure.

Meanwhile, in a display device having an organic light-emitting diode, which is a light-emitting device, for each subpixel, like an organic light-emitting display device, a circuit device including, at a minimum, 2 transistors and a capacitor (2T1C) must be included in each small subpixel in order to express selective gradation of each subpixel. In this case, the thin-film transistors have the same structure. Since the size of each subpixel is small, however, a driving thin-film transistor is saturated within a short time when gate voltage is applied, although device characteristics, such as mobility of the thin-film transistors, are improved. As a result, various and sufficient expression of gradation is difficult.

That is, the size of each subpixel is reduced for high resolution, and circuits for driving each subpixel are included in the limited area of each subpixel. In the case in which the driving thin-film transistor and the other thin-film transistor are provided so as to have the same stack structure, the response speed of the driving thin-film transistor is rapid, but sufficient expression of gradation is difficult.

Figure 2:
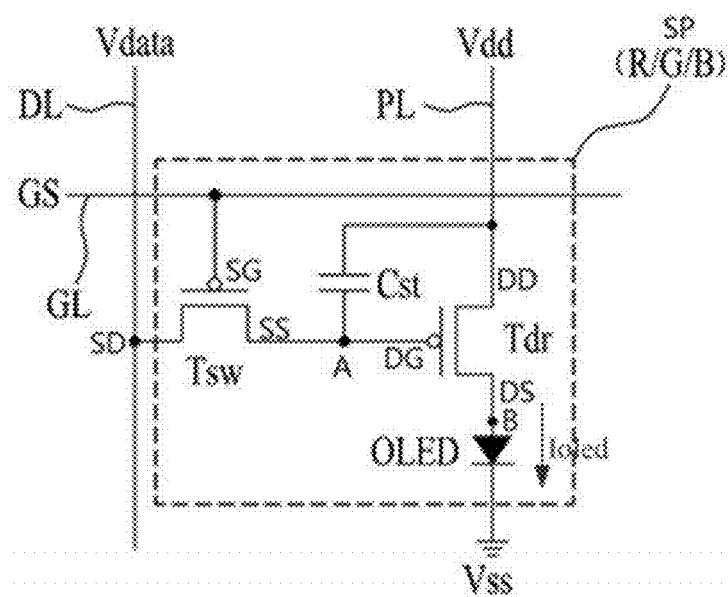
FIG. 2 is a circuit diagram of each subpixel of a backplane substrate according to the present disclosure.

FIG. 2 is a circuit diagram of each subpixel of a backplane substrate according to the present disclosure.

The backplane substrate is configured such that a substrate (not shown) is mainly divided into two parts: a central part and an edge part. The central part is defined as an active area AA, and the edge part around the active area AA is defined as a non-active area, in which wires and a pad electrode are formed. The active area AA includes a plurality of subpixels SP arranged in the form of a matrix. Each subpixel has the circuit shown in FIG. 2. As shown in FIG. 2, each subpixel has a gate line GL extending in the horizontal direction and a first voltage line PL and a data line DL that intersect the gate line GL and are parallel to each other. A switching thin-film transistor Tsw is provided at the intersection between the gate line GL and the data line DL. A driving thin-film transistor Tdr is provided between the switching thin-film transistor Tsw and the first voltage line PL. An organic light-emitting diode OLED is connected to a source electrode of the driving thin-film transistor Tdr. A storage capacitor Cst is provided between a drain electrode and a gate electrode of the driving thin-film transistor Tdr. Here, each thin-film transistor is a pMOS, and an active layer with a channel has a p-type doped area.

The driving thin-film transistor Tdr has a first gate electrode DG connected to the switching thin-film transistor Tsw, a first drain electrode DD connected to the first voltage line PL, and a first source electrode DS connected to the organic light-emitting diode OLED.

The switching thin-film transistor Tsw has a second gate electrode SG connected to the gate line GL, a second drain electrode SD connected to the data line DL, and a second source electrode SS connected to one node of the storage capacitor Cst and the first gate electrode DG of the driving thin-film transistor Tdr.

Here, the connection node between the switching thin-film transistor Tsw and the driving thin-film transistor Tdr is referred to as a first node A, and the connection node between the driving thin-film transistor Tdr and the organic light-emitting diode OLED is referred to as a second node B.

A first electrode (anode) of the organic light-emitting diode OLED is connected to the second node B. The organic light-emitting diode OLED has the first electrode, a second electrode (cathode) connected to a ground terminal, and an organic layer including organic emissive layers formed at the first and second electrodes. Here, the organic layer may include a single organic emissive layer. Alternatively, a hole injection layer and a hole transport layer may be selectively or totally included between the first electrode and the organic emissive layer, and an electron transport layer and an electron injection layer may be selectively or totally included between the organic emissive layer and the second electrode.

The switching thin-film transistor Tsw is connected to the gate line GL and the data line DL to select a subpixel. The driving thin-film transistor Tdr drives the organic light-emitting diode OLED of the subpixel selected by the switching thin-film transistor Tsw.

Depending on the circumstances, an additional thin-film transistor may be provided. For example, in the case in which a sensing thin-film transistor Tref is provided, the sensing thin-film transistor Tref is connected between a sensing line SSL and a second voltage line RL to sense or initialize the voltage value of the second node B.

The switching thin-film transistor Tsw is switched to supply data voltage Vdata, supplied to the data line DL, to the driving thin-film transistor Tdr in response to a gate signal GS supplied to the gate line GL. The driving thin-film transistor Tdr is switched to control data current Ioled flowing to the organic light-emitting diode OLED using driving voltage Vdd supplied to the first voltage line PL in response to the data voltage Vdata supplied from the switching thin-film transistor Tsw. The capacitor Cst is connected between the first drain electrode and the first gate electrode to store voltage corresponding to the data voltage Vdata that is supplied to the first gate electrode and to turn on the driving thin-film transistor Tdr using the stored voltage.

The organic light-emitting diode OLED is electrically connected between the first source electrode of the driving thin-film transistor Tdr and a ground line VSS to emit light using the data current Ioled supplied from the driving thin-film transistor Tdr.

When the above-described circuit is included in each subpixel to constitute an organic light-emitting display device, therefore, subpixels R, G, and B control the magnitude of the data current Ioled flowing from the driving voltage Vdd to the organic light-emitting diode OLED using switching of the driving thin-film transistor Tdr based on the data voltage Vdata to make the organic light-emitting diode OLED emit light, thereby displaying a predetermined image.

Hereinafter, the construction of the driving thin-film transistor Tdr and the switching thin-film transistor Tsw provided in each subpixel of the backplane substrate and the organic light-emitting display device according to the present disclosure will be described with reference to cross-sectional views. The circuit connection therebetween is shown in FIG. 2.

Figure 3:
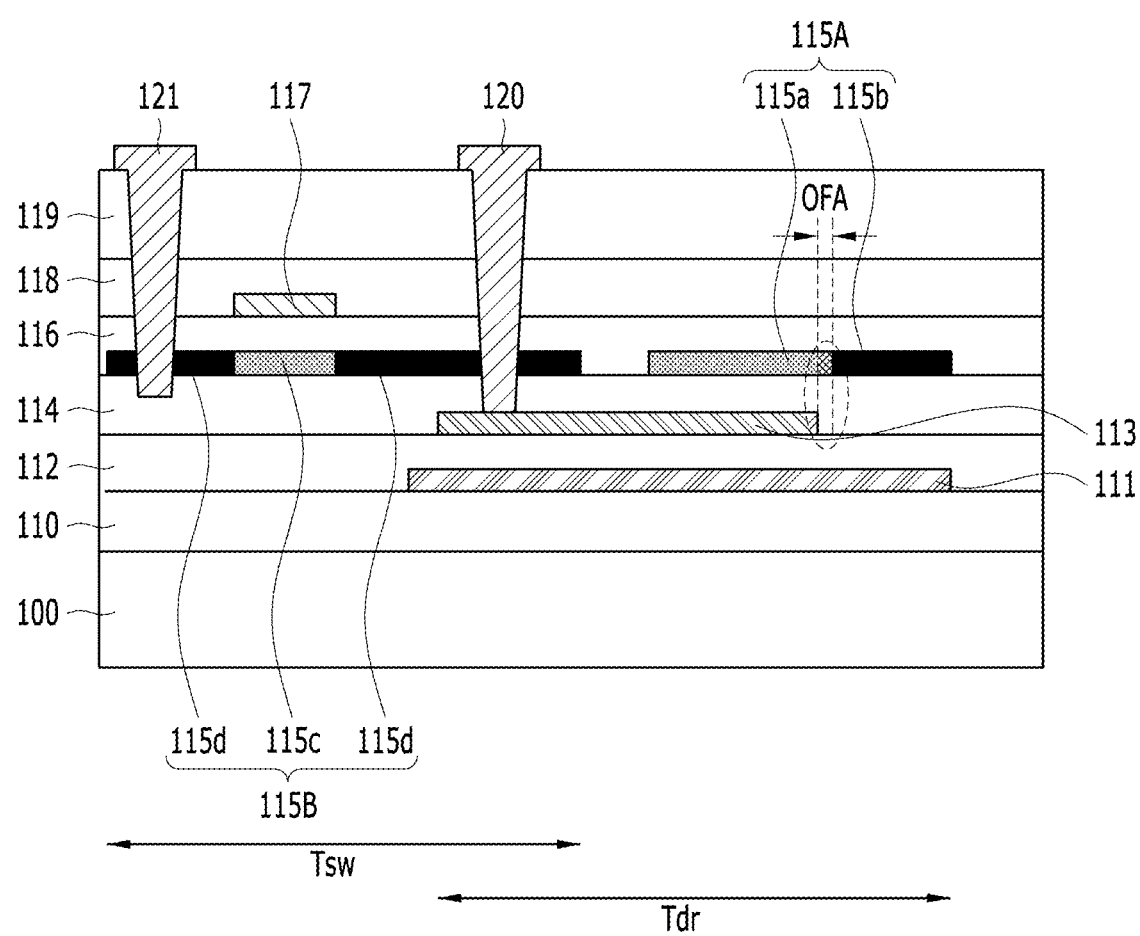
FIG. 3 is a cross-sectional view showing a backplane substrate according to a first aspect of the present disclosure.

FIG. 3 is a cross-sectional view showing a backplane substrate according to a first aspect of the present disclosure.

FIG. 3 shows a subpixel of the backplane substrate according to the first aspect of the present disclosure. A driving thin-film transistor Tdr and a switching thin-film transistor Tsw connected thereto are partially shown. Each subpixel is configured such that structures identical to the shown structure are repeatedly arranged.

The driving thin-film transistor Tdr includes a first gate electrode 113, a first active layer 115A, a first source electrode DS (shown in FIG. 2) and a first drain electrode DD (shown in FIG. 2) connected to the opposite sides of the first active layer 115A, and a first gate insulating film 114 provided between the first active layer 115A and the first gate electrode 113.

The switching thin-film transistor Tsw includes a second gate electrode 117, a second active layer 115B, a second source electrode 120 (SS) (shown in FIG. 2) and a second drain electrode 121 (SD) (shown in FIG. 2) connected to the opposite sides of the second active layer 115B, and a second gate insulating film 116 provided between the second active layer 115B and the second gate electrode 117.

That is, the driving thin-film transistor Tdr and the switching thin-film transistor Tsw have the first and second active layers 115A and 115B on the same layer, and have the first and second gate electrodes 113 and 117 on different layers. More specifically, the first gate electrode 113 is located lower than the first active layer 115A, and the second gate electrode 117 is located higher than the second active layer 115B. Consequently, the first gate electrode 113 under the first active layer 115A may extend to partially overlap the second active layer 115B, and the second source electrode 120 may extend downwardly to be connected to the region of the first gate electrode 113 that overlaps the second active layer 115B. In this case, the second source electrode 120 extends through the second active layer 115B to be connected to the upper part of the first gate electrode 113 under the second active layer 115B.

Meanwhile, the first active layer 115A has an offset area OFA, protruding from the edge of the first gate electrode 113 by a predetermined width in a planar state, and a first doped area 115$b$, which abuts the offset area OFA and is spaced apart from the edge of the first gate electrode 113.

In the driving thin-film transistor Tdr according to the present disclosure, the offset area OFA is provided to increase the period from the off state of the driving thin-film transistor to the on state of the driving thin-film transistor, thereby diversifying the expression of gradation.

In order to describe the above, an S-Factor will be described. Equation 1 represents an S-Factor.

$$S = 2.3 \frac{kT}{q} \left[ 1 + \frac{(Cd + Cit)}{Ci} \right] \quad \text{[Equation 1]}$$

In the graph of Vgs-Ids of an organic light-emitting display device, S-Factor corresponds to the inverse of the tilt of Ids until saturation after switching on. The S-Factor is represented by Equation 1. A large S-Factor means that ΔVgs, by which gradation modulation is possible, is relatively large. This means that it is possible to diversify the expression of gradation when this value is a predetermined value or more.

Here, Ci means the capacitance of the gate insulating film, Cd means the capacitance of the offset area (depletion area), and Cit means the capture density in the gap of the gate insulating film.

As can be seen from the equation for calculating the S-Factor, on the assumption that the other conditions are the same, the value of Cd is increased as the offset area is increased, which increases the S-Factor.

In the present disclosure, the expression of gradation is diversified using the driving thin-film transistor having the increased S-Factor value, and the other transistor (e.g. the switching thin-film transistor) has a small S-Factor, which is advantageous for high resolution and to maintain a rapid response speed of the transistor. If the other transistor also has the offset period, the overall speed of the subpixel may be reduced. For this reason, only the driving thin-film transistor for expression of high gradation has the offset area. In addition, the doped area may be changed by changing the stack structure of the driving thin-film transistor and the switching thin-film transistor, whereby no additional mask for providing the offset area need be used.

In the backplane substrate according to the first aspect of the present disclosure, the first active layer 115A directly abuts a first channel 115a that overlaps the first gate electrode 113 so as to have the offset area OFA, and is spaced apart from the first channel 115a by the offset area OFA so as to have the first doped area 115b.

The first doped area 115b may include a p-type dopant.

The first channel 115a and the offset area OFA may be intrinsic areas without a dopant.

The offset area OFA and the first doped area 115b do not overlap the first gate electrode 113.

The second active layer 115B has a second doped area 115d vertically aligned with the edge of the second gate electrode 117. An area of the second active layer 115B that overlaps the second gate electrode 117 is a second channel 115, which may be an intrinsic area. The second doped area 115d is defined by a part exposed from the second gate electrode 117. The second doped area 115d is defined without an additional mask. The reason for this is that the second gate electrode 117 is used as a mask.

The dopants in the first and second doped areas 115b and 115d may be of the same type, may be defined in the same process, and may be p+ type dopants, such as boron.

Meanwhile, the first channel 115a and the offset area OFA are exposed upwardly without electrodes, like the first doped area 115b. The reason for this is that the structure that covers the upper parts of the first channel 115a and the first doped area 115b is removed in a dopant doping process. Depending on the circumstances, the structure that covers the upper parts of the first channel 115a and the first doped area 115b may remain for use as an auxiliary gate electrode of the driving thin-film transistor Tdr. (This structure will be described below when describing a backplane substrate according to a second aspect of the present disclosure.)

Meanwhile, the offset area OFA of the present disclosure protrudes further outward than the first gate electrode 113. This is the structure located above the first active layer 115A in the doped area, the width of which may be adjusted.

In addition, the present disclosure has the effect of integration due to the vertical connection relationship between the driving thin-film transistor Tdr and the switching thin-film transistor Tsw in addition to the offset area.

That is, the first gate electrode 113 overlaps the second active layer 115B and is connected to the second source electrode 120. Specifically, the second source electrode 120 may be connected to the first gate electrode 113 at the overlapping region between the second active layer 115B and the first gate electrode 113 through the second active layer 115B. The wires and the active layer at the connection region excluding insulating films are sequentially located from top to bottom as follows. A planar portion of the second source electrode 120 is located at the uppermost position, the second active layer 115B and the second gate electrode 113 are located thereunder, and the second source electrode 120 vertically extends through the second active layer 115B.

The second source electrode 120 of the switching thin-film transistor Tsw and the first gate electrode 113 of the driving thin-film transistor Tdr are vertically connected to each other. Compared to a conventional horizontal connection structure, therefore, integration is possible and circuits are received in a small area, which is advantageous in realizing high resolution.

In addition, a first storage electrode 111 that overlaps the first gate electrode 113 is provided under the first gate electrode 113. In this case, a first interlayer insulating film 112 and a storage capacitor are provided between the first gate electrode 113 and the first storage electrode 111, which overlap each other.

Meanwhile, there are insulating films as elements that have not been described in the above construction. Detailed descriptions on the insulating films are as follows.

A buffer layer 110 is located on a substrate 100. A first interlayer insulating film 112 is located so as to cover a first storage electrode 111 on the buffer layer 110. A first gate electrode 113 that overlaps the first storage electrode 111 is located on the first interlayer insulating film 112. A first gate insulating film 114 is located so as to cover the first gate electrode 113. A first active layer 115A and a second active layer 115B are located on the first gate insulating film 114 so as to be spaced apart from each other. A second gate insulating film 116 is located so as to cover the first active layer 115A and the second active layer 115B. A second gate electrode 117 that partially overlaps the second active layer 115B is located on the second gate insulating film 116. A second interlayer insulating film 118 is located so as to cover the second gate electrode 117. In succession, a third interlayer insulating film 119 is located thereon. The third interlayer insulating film 119, the second interlayer insulating film 118, the second gate insulating film 116, the second active layer 115B, and the first gate insulating film 114 are removed to a predetermined diameter to form a first contact hole (see a region where a second source electrode is formed). A second source electrode 120 connected to the exposed first gate electrode 113 and the same layers are removed to a predetermined diameter to form a second contact hole (i.e., a region where a second drain electrode is formed). A second drain electrode 121 extends through the second active layer 115B from the other side thereof for connection.

The first and second contact holes are formed by excessively etching the respective ends of the second active layer 115B to such an extent that the first gate electrode 113 under the second active layer 115B is exposed. In this case, no metal is provided under the second active layer 115B at the region of the second drain electrode 121. Consequently, only the first gate insulating film 114 is etched.

Depending on the circumstances, the second drain electrode 121 and the second source electrode 120 may have different layer structures. In this case, the second drain electrode 121 may be connected to the upper end of the second active layer 115B. In this case, however, masks for the second source electrode 120 and the second drain electrode 121 are different, whereby a smaller number of masks may be used than in the above example.

Meanwhile, the first and second active layers 115A and 115B may be made of polysilicon. The reason for this is that it is possible to achieve high-speed driving through high mobility of the active layers in the integrated subpixel.

A method of manufacturing the backplane substrate according to the first aspect of the present disclosure will be described below.

In the backplane substrate according to the first aspect of the present disclosure, the offset area OFA is provided at the driving thin-film transistor Tdr. Consequently, it is possible to diversify the expression of gradation due to an increased S-Factor. In addition, the switching thin-film transistor Tsw and the driving thin-film transistor Tdr are vertically connected to each other. Consequently, circuit integration in the subpixel is easily achieved, which is advantageous in realizing high resolution.

Figure 4:
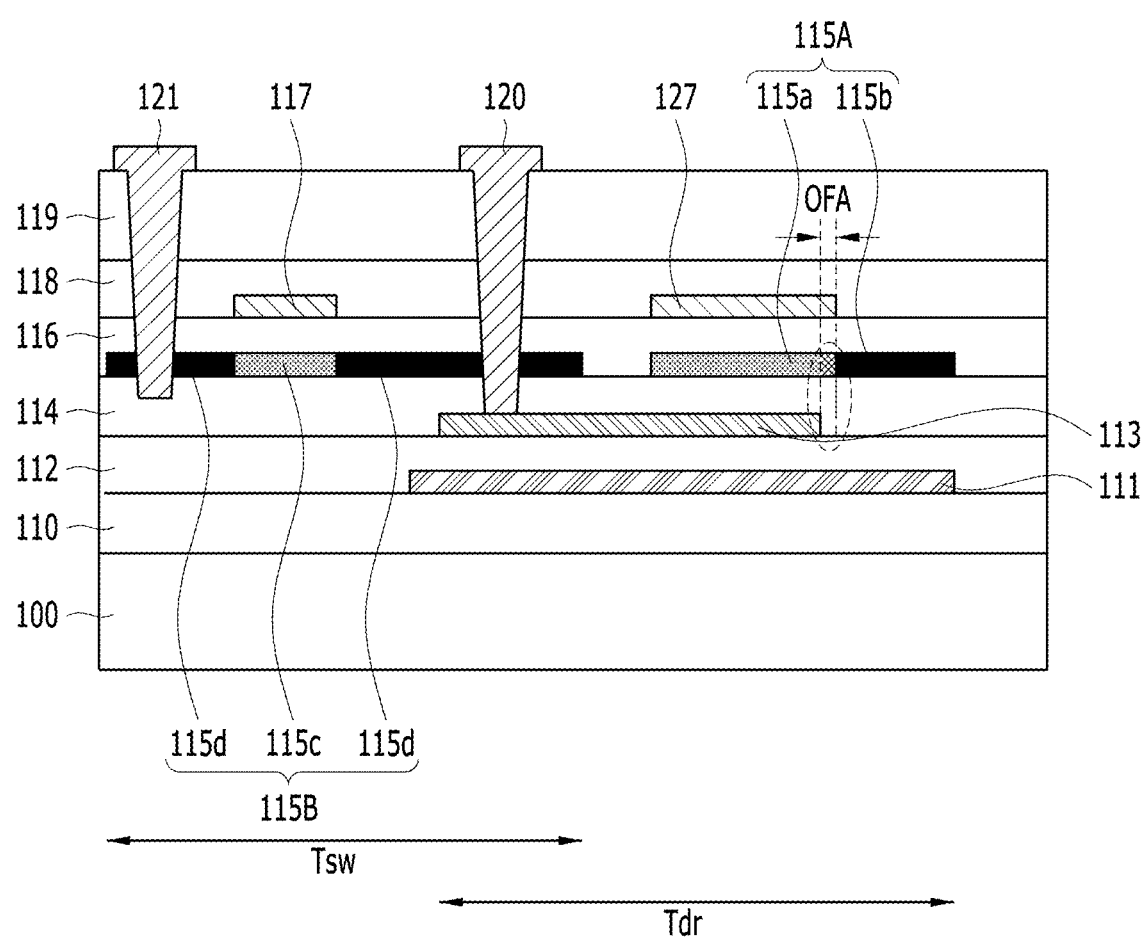
FIG. 4 is a cross-sectional view showing a backplane substrate according to a second aspect of the present disclosure.

FIG. 4 is a cross-sectional view showing a backplane substrate according to a second aspect of the present disclosure.

The backplane substrate according to the second aspect of the present disclosure shown in FIG. 4 is different from that of the first aspect in that a first gate auxiliary electrode 127, provided to define the first doped area 115b of the first active layer 115A, remains. The backplane substrate according to the second aspect of the present disclosure has the same effects in that high integration and diversification in expression of gradation of the driving thin-film transistor Tdr due to the provision of the offset area OFA, described in the first aspect, are possible.

Furthermore, since the first gate auxiliary electrode 127 is provided, an electrical signal between the first gate electrode 113 and the first gate auxiliary electrode 127 is shared, thereby improving the efficiency of the driving thin-film transistor Tdr. In addition, no additional process of removing the first gate auxiliary electrode 127 is required, thereby reducing the number of masks compared to the first aspect.

Meanwhile, a description of parts of the second aspect that are identical to those of the first aspect will be omitted.

Figure 5:
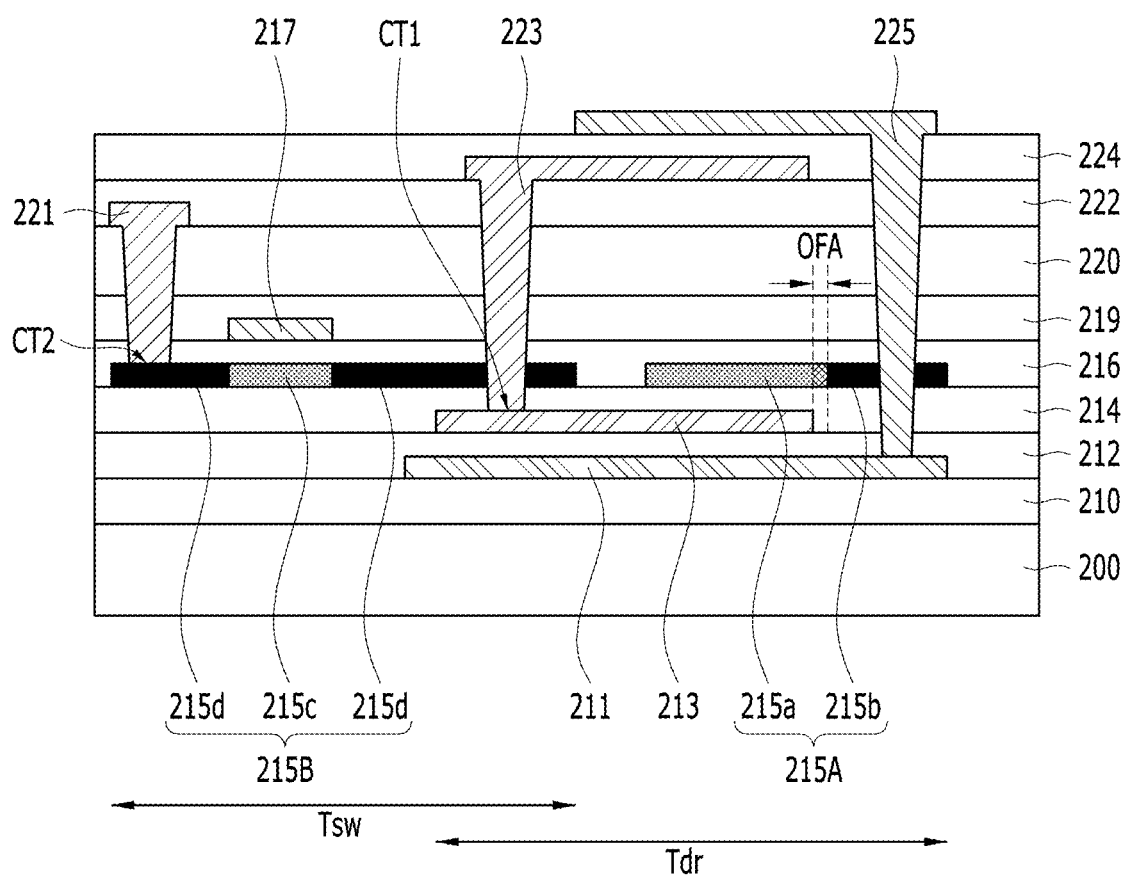
FIG. 5 is a cross-sectional view showing a backplane substrate according to a third aspect of the present disclosure.

FIG. 5 is a cross-sectional view showing a backplane substrate according to a third aspect of the present disclosure.

In the backplane substrate according to the third aspect of the present disclosure, as shown in FIG. 5, a driving thin-film transistor Tdr includes a first gate electrode 213, a first active layer 215A, a first source electrode DS (shown in FIG. 2) and a first drain electrode DD (shown in FIG. 2) connected to the opposite sides of the first active layer 215A, and a first gate insulating film 214 provided between the first active layer 215A and the first gate electrode 213.

A switching thin-film transistor Tsw includes a second gate electrode 217, a second active layer 215B, a second source electrode 223 (SS) (shown in FIG. 2) and a second drain electrode 221 (SD) (shown in FIG. 2) connected to the opposite sides of the second active layer 215B, and a second gate insulating film 216 provided between the second active layer 215B and the second gate electrode 217.

That is, the driving thin-film transistor Tdr and the switching thin-film transistor Tsw have the first and second active layers 215A and 215B on the same layer, and have the first and second gate electrodes 213 and 217 on different layers. More specifically, the first gate electrode 213 is located lower than the first active layer 215A, and the second gate electrode 217 is located higher than the second active layer 215B. Consequently, the first gate electrode 213 under the first active layer 215A may extend so as to partially overlap the second active layer 215B, and the second source electrode 223 may extend downwardly so as to be connected to the region of the first gate electrode 213 that overlaps the second active layer 215B. In this case, the second source electrode 223 extends through the second active layer 215B so as to be connected to the upper part of the first gate electrode 213 under the second active layer 215B.

Meanwhile, the first active layer 215A has an offset area OFA protruding from the edge of the first gate electrode 213 by a predetermined width in a planar state and a first doped area 215b that abuts the offset area OFA and is spaced apart from the edge of the first gate electrode 213. Consequently, the turn-on time is increased in the graph of Vgs-Ids of the driving thin-film transistor Tdr, thereby diversifying the expression of gradation.

Furthermore, in the third aspect of the present disclosure, as shown in FIG. 5, a first storage electrode 211, which overlaps the first gate electrode 213, is provided under the first gate electrode 213. In addition, the second source electrode 223 connected to the first gate electrode 213 may have a planar portion on a layer different from that of the second drain electrode 221.

A first contact hole CT1 between the planar portion of the second source electrode 223 and the first gate electrode 213 may have a greater depth than a second contact hole CT2 between the upper surface of the second drain electrode 221 and the second active layer 215B. The reason for this is that the planar portion of the second source electrode 223 is located on a layer different from the layer on which the planar portion of the second drain electrode 221 is located and that the first contact hole CT1 is more excessively etched to expose the second active layer 215B and the first gate insulating film 214.

In addition, a first storage auxiliary electrode 225 that is perpendicularly connected to the first storage electrode 211 and overlaps the planar portion of the second source electrode 223 is further provided to increase an overlapping region, thereby improving storage capacitance.

In addition, the region is shared through the vertical connection between the driving thin-film transistor Tdr and the switching thin-film transistor Tsw. Consequently, circuits may be integrated in each subpixel, which is advantageous in realizing integration.

Meanwhile, there are insulating films as elements that have not been described in the above construction. Detailed descriptions on the insulating films are as follows.

A buffer layer 210 is located on a substrate 200. A first interlayer insulating film 212 is located so as to cover a first storage electrode 211 on the buffer layer 210. A first gate electrode 213, which overlaps the first storage electrode 211, is located on the first interlayer insulating film 212. A first gate insulating film 214 is located so as to cover the first gate electrode 213. A first active layer 215A and a second active layer 215B are located on the first gate insulating film 214 so as to be spaced apart from each other. A second gate insulating film 216 is located so as to cover the first active layer 215A and the second active layer 215B. A second gate electrode 217 that partially overlaps the second active layer 215B is located on the second gate insulating film 216. A second interlayer insulating film 219 is located so as to cover the second gate electrode 217. In succession, a third interlayer insulating film 220 is located thereon. The third interlayer insulating film 220, the second interlayer insulating film 219, the second gate insulating film 216, the second active layer 215B, and the first gate insulating film 214 are removed to a predetermined diameter to form a first contact hole CT1 (see FIG. 5). A second source electrode 223 connected to the exposed first gate electrode 213 is provided. A second drain electrode 221 is formed so as to be connected to a second doped area 215d of the second active layer 215B, exposed by removing the third interlayer insulating film 220, the second interlayer insulating film 219, and the second gate insulating film 216.

A third interlayer insulating film 222 is provided between the planar portion of the second source electrode 223 and the planar portion of the second drain electrode 221. A fourth interlayer insulating film 224 is provided between a planar portion of the first storage auxiliary electrode 225 and the planar portion of the second source electrode 223.

Storage capacitance in the third aspect is further improved than in the first and second aspects. Even when the area of each subpixel is small due to high integration, it is possible to provide sufficient storage capacitance.

Meanwhile, the first and second active layers 215A and 215B may be made of polysilicon. The reason for this is that it is possible to achieve high-speed driving through high mobility of the active layers in the integrated subpixel. In addition, the offset area OFA is not provided at the second active layer 215B but is provided at the first active layer 215A, whereby high gradation may be expressed by the driving thin-film transistor.

Figure 6:
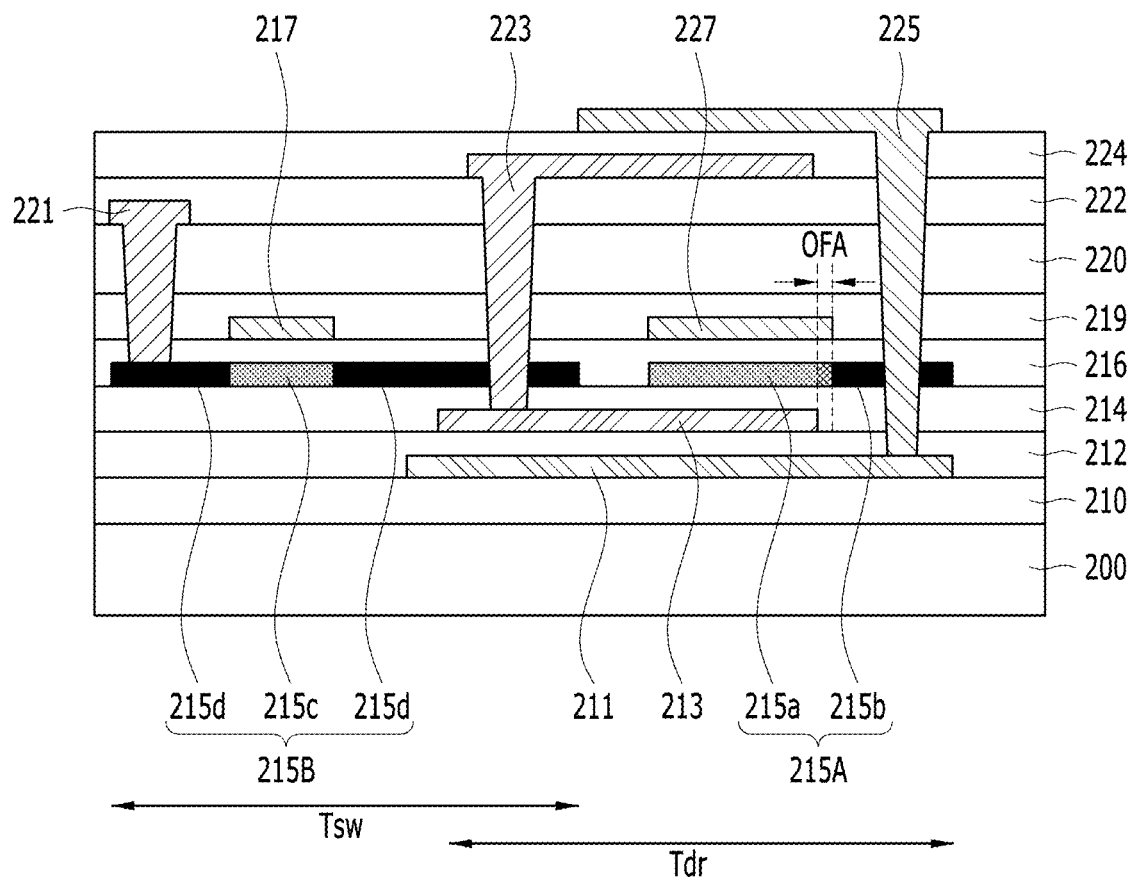
FIG. 6 is a sectional view showing a backplane substrate according to a fourth aspect of the present disclosure.

FIG. 6 is a cross-sectional view showing a backplane substrate according to a fourth aspect of the present disclosure.

The backplane substrate according to the fourth aspect of the present disclosure shown in FIG. 6 is different from the backplane substrate according to the aspect shown in FIG. 3 in that a first gate auxiliary electrode 227 is further provided on the first active layer 215B such that the first gate auxiliary electrode 227 can be used as a mask to define the first doped area 215b of the first active layer 215B.

The remaining construction of the backplane substrate shown in FIG. 6 is identical to that of the backplane substrate shown in FIG. 5, and therefore a description thereof will be omitted.

In the above structure, the driving thin-film transistor Tdr has a bottom gate shape having an offset area, and the switching thin-film transistor Tsw has a top gate shape. The driving thin-film transistor Tdr and the switching thin-film transistor Tsw are different from each other in terms of construction and operation. Even in an ultra-high resolution structure, the driving thin-film transistor is capable of expressing high gradation, and the switching thin-film transistor is capable of having circuit characteristics of high mobility.

Hereinafter, a method of manufacturing the backplane substrate according to the present disclosure will be described with reference to the drawings.

FIGS. 7A to 7E are cross-sectional views showing a method of manufacturing a backplane substrate according to the first aspect of the present disclosure.

The following processes are carried out in a single subpixel. In a plurality of subpixels, the same structures may be repeatedly formed using the same manufacturing method.

First, a substrate 100 (shown in FIG. 7A) having a plurality of subpixels is prepared.

Figure 7A:
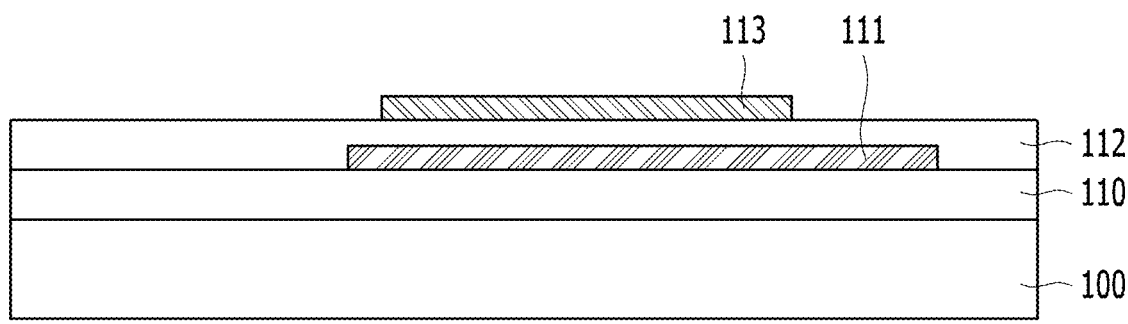
FIGS. 7A to 7E are process sectional views showing a method of manufacturing a backplane substrate according to the first aspect of the present disclosure.

Subsequently, as shown in FIG. 7A, a buffer layer 110 is formed on the entire surface of the substrate 100 with respect to each subpixel, and then a first storage electrode 111 is formed on a predetermined region of the buffer layer 110.

Subsequently, a first interlayer insulating film 112 is formed so as to cover the first storage electrode 111.

Subsequently, a first gate electrode 113 is formed on the first interlayer insulating film 112.

Figure 7B:
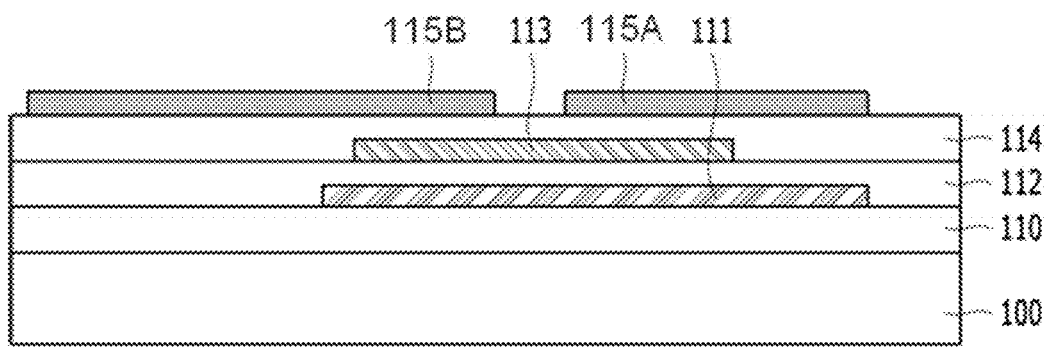

Subsequently, as shown in FIG. 7B, a first gate insulating film 114 is formed so as to cover the first gate electrode 113.

Subsequently, amorphous silicon is deposited on the first gate insulating film 114, and then the amorphous silicon is crystallized through dehydrogenation and laser application to form polysilicon. The polysilicon is then patterned to form first and second active layers 115a and 115c, which are spaced apart from each other. The second active layer 115c partially overlaps the first gate electrode 113. In this step, the first and second active layers 115a and 115c are an undoped intrinsic state.

Figure 7C:
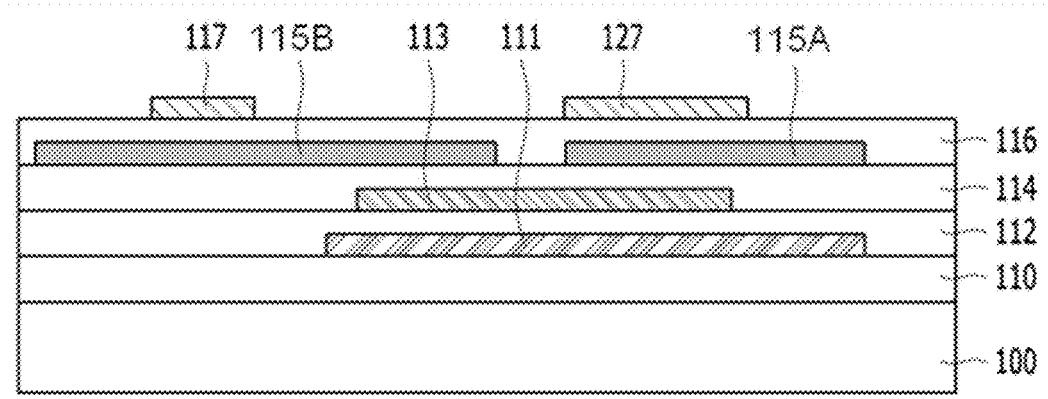

Subsequently, as shown in FIG. 7C, a second gate insulating film 116 is formed so as to cover the first and second active layers 115a and 115c.

Subsequently, a second gate electrode 117, which overlaps the second active layer 115B, and a first gate auxiliary electrode 127, which overlaps the first active layer 115A and protrudes further than the first gate electrode 113, are formed on the second gate insulating film 116.

Figure 7D:
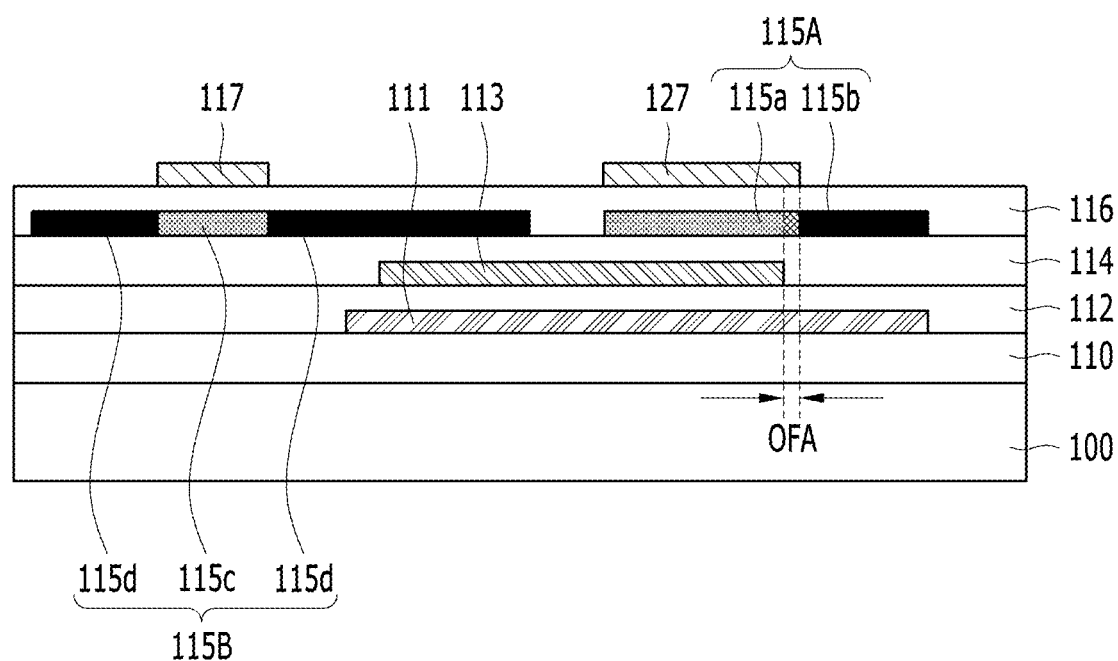

Subsequently, as shown in FIG. 7D, a first active layer 115A and a second active layer 115B are doped with a p+ type dopant using the second gate electrode 117 and the first gate auxiliary electrode 127 as masks to form a first doped area 115b and a second doped area 115d in the first active layer 115A and the second active layer 115B, respectively.

Here, undoped areas 115a and 115c are intrinsic areas. Particularly, an area of the second active layer 115B that overlaps the second gate electrode 117 inside the second doped area 115d becomes a second channel 115c, and an area of the first active layer 115A that overlaps the first gate electrode 113 becomes a first channel 115a. An area that directly abuts the first channel 115a and is located between the first channel 115a and the first doped area 115b, which is one of the intrinsic areas, is an offset area OFA, which is an element that has an increased S-Factor to thereby diversify the expression of gradation after a driving thin-film transistor Tdr is finally formed.

Figure 7E:
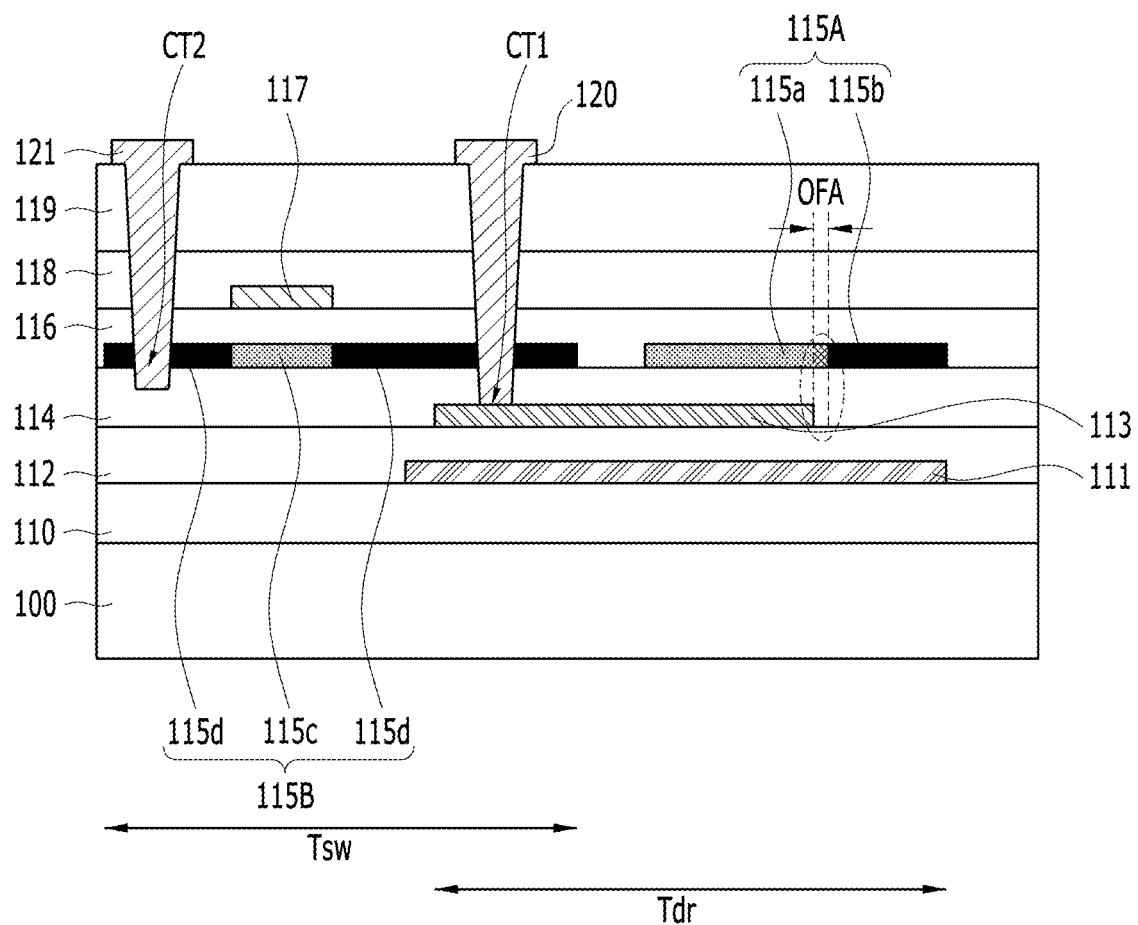

Subsequently, as shown in FIG. 7E, the first gate auxiliary electrode 127 is selectively removed.

Subsequently, a second interlayer insulating film 118 and a third interlayer insulating film 119 are successively formed by deposition so as to cover the second gate electrode 117. The third interlayer insulating film 119, the second interlayer insulating film 118, the second gate insulating film 116, the first and second active layers 115A and 115B, and the first gate insulating film 114 are selectively removed to form contact holes extending through the first and second active layers 115A and 115B (only first and second contact holes CT1 and CT2 are shown in FIG. 7E; shown in FIG. 10 with respect to third and fourth contact holes). The contact hole CT1 is formed by etching one side of the second active layer 115B, under which the first gate electrode 113 is provided, to such an extent that the first gate electrode 113 is exposed. In the same process, the contact hole CT2 is formed through the other side of the second active layer 115B so as to have the same or similar depth.

Subsequently, a first source electrode DS (shown FIG. 2) and a first drain electrode DD (shown FIG. 2), extending through the opposite sides of the first active layer 115A so as to side-contact the first active layer 115A, and a second source electrode 120 and a second drain electrode 121, extending through the opposite sides of the second active layer 115B so as to side-contact the second active layer 115B, are formed. The second source electrode 120 is connected to the first gate electrode 113.

FIGS. 8A to 8E are cross-sectional views showing a method of manufacturing a backplane substrate according to a second aspect of the present disclosure.

In the method of manufacturing the backplane substrate according to the second aspect of the present disclosure, processes shown in FIGS. 8A to 8D are identical to those of the method according to the first aspect, and therefore a description thereof will be omitted.

In the method of manufacturing the backplane substrate according to the second aspect of the present disclosure, first and second doped areas 115b and 115d are defined, and a first gate auxiliary electrode 227, used as a doping mask, is not removed but remains.

Figure 8A:
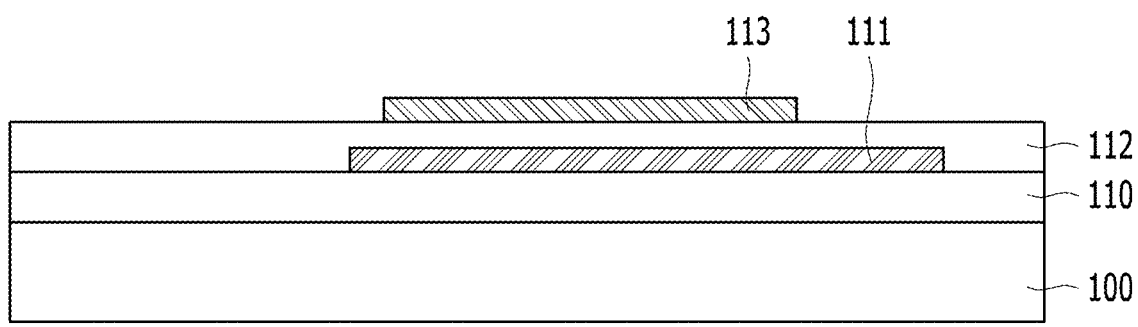
FIGS. 8A to 8E are process sectional views showing a method of manufacturing a backplane substrate according to the second aspect of the present disclosure.
Figure 8B:
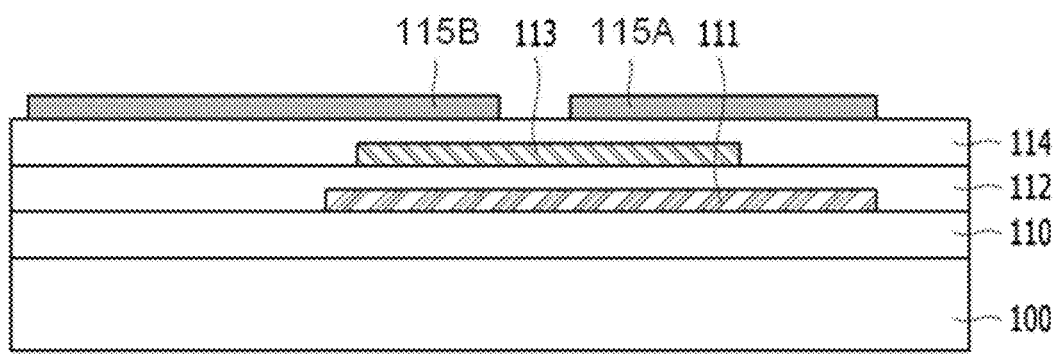
Figure 8C:
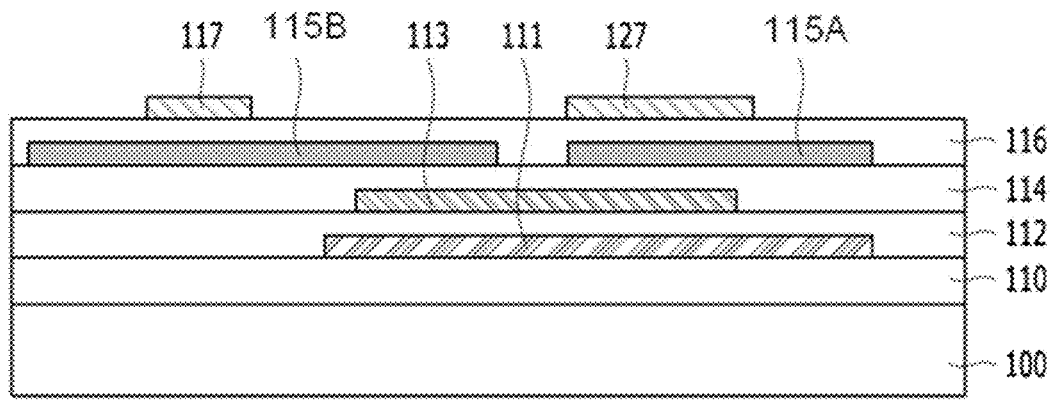
Figure 8D:
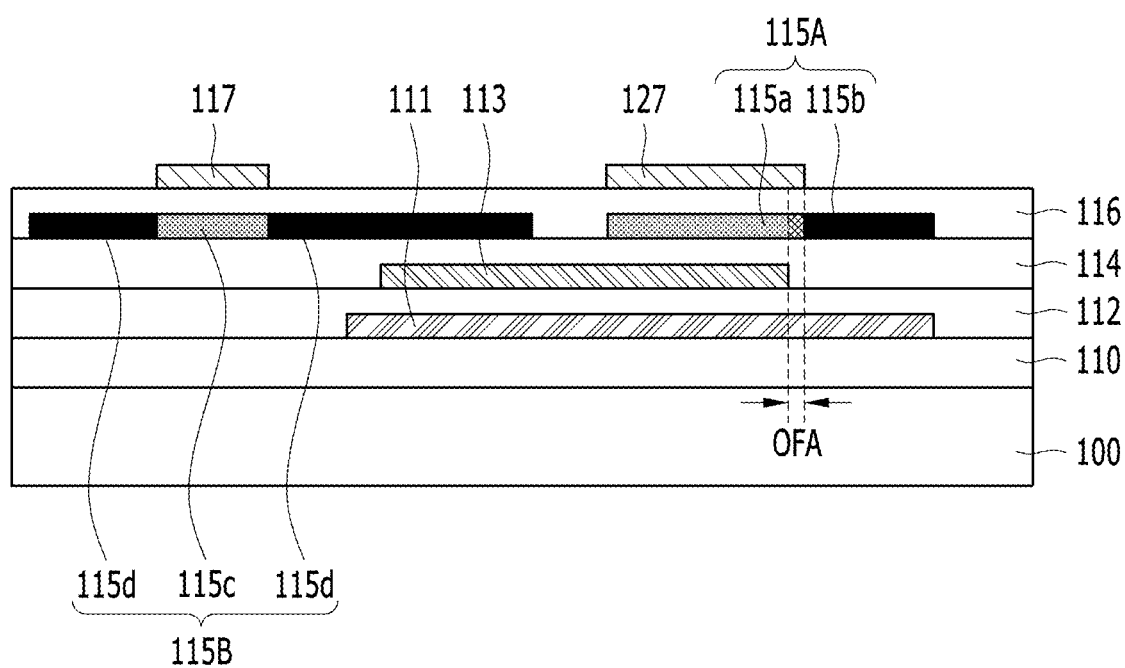
Figure 8E:
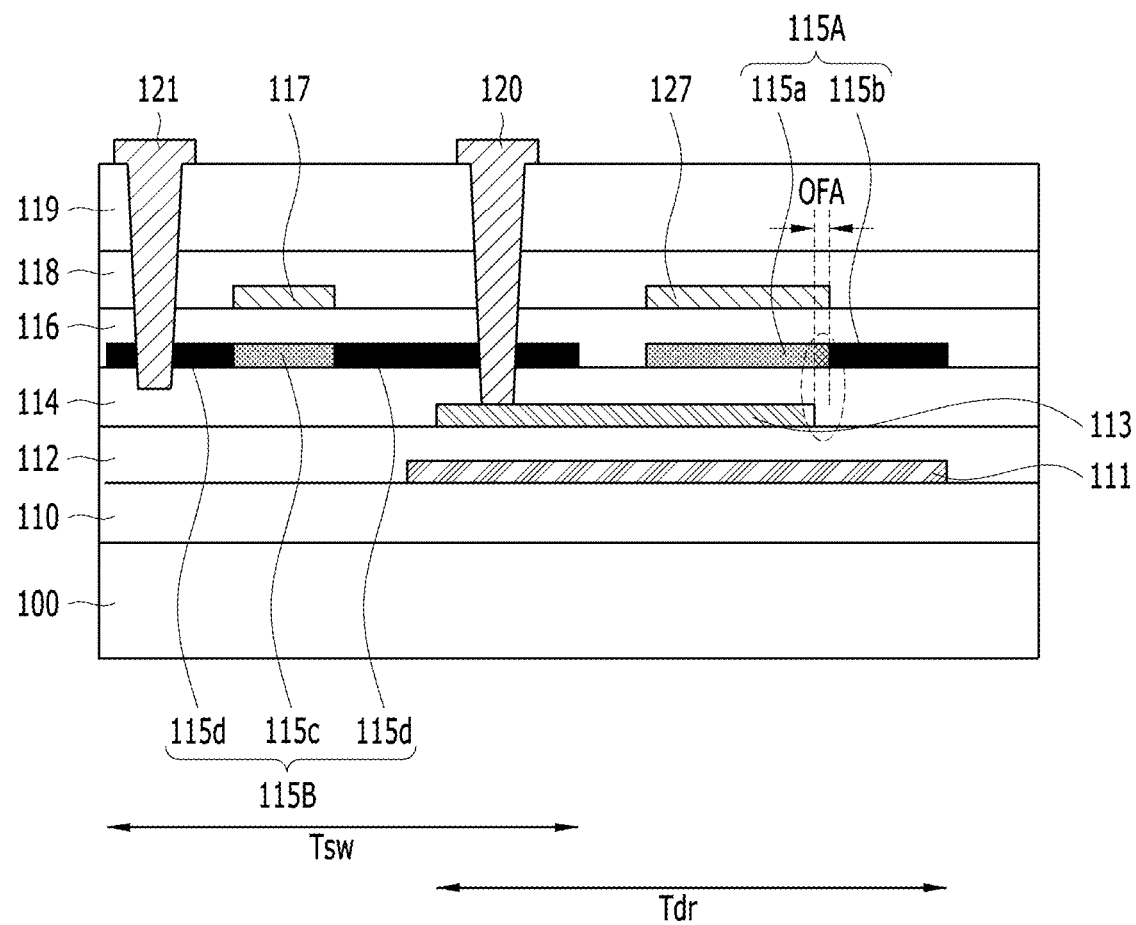

Subsequently, in the process shown in FIG. 8E, contact holes, a first source electrode DS (shown in FIG. 2), a first drain electrode DD (shown in FIG. 2), a second source electrode 120, and a second drain electrode 121 are formed.

This process is identical to that described in connection with the first aspect, and thereof a description thereof will be omitted.

FIGS. 9A to 9E are process sectional views showing a method of manufacturing a backplane substrate according to a third aspect of the present disclosure.

First, a substrate 200 (shown FIG. 9A) having a plurality of subpixels is prepared.

Figure 9A:
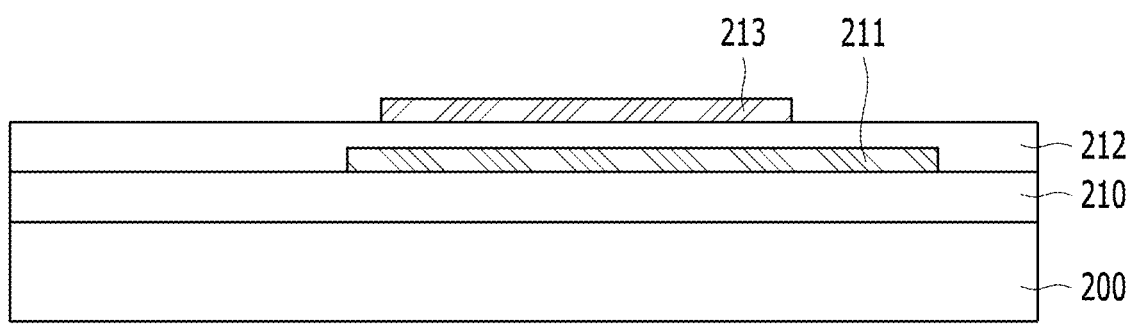
FIGS. 9A to 9F are cross-sectional views showing a method of manufacturing a backplane substrate according to the third aspect of the present disclosure.

Subsequently, as shown in FIG. 9A, a buffer layer 210 is formed on the entire surface of the substrate 200 with respect to each subpixel, and then a first storage electrode 211 is formed on a predetermined region of the buffer layer 210.

Subsequently, a first interlayer insulating film 212 is formed so as to cover the first storage electrode 211.

Subsequently, a first gate electrode 213 is formed on the first interlayer insulating film 212.

Figure 9B:
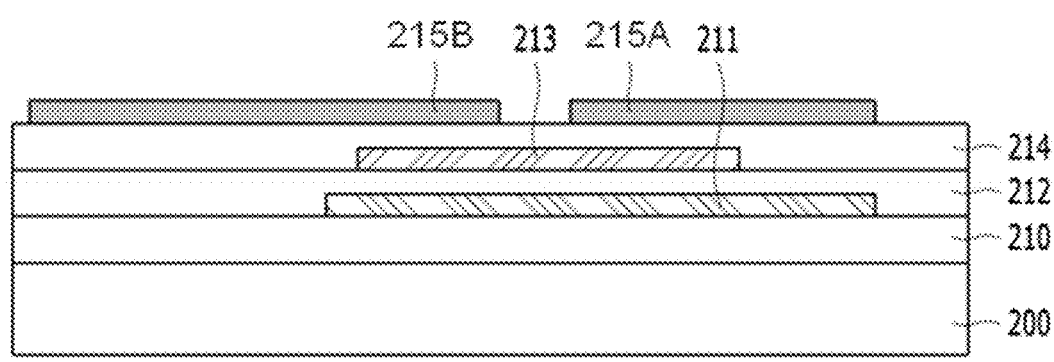

Subsequently, as shown in FIG. 9B, a first gate insulating film 214 is formed so as to cover the first gate electrode 213.

Subsequently, first and second active layers 215A and 215B, which are spaced apart from each other, are formed on the first gate insulating film 214. The second active layer 215B partially overlaps the first gate electrode 213.

Figure 9C:
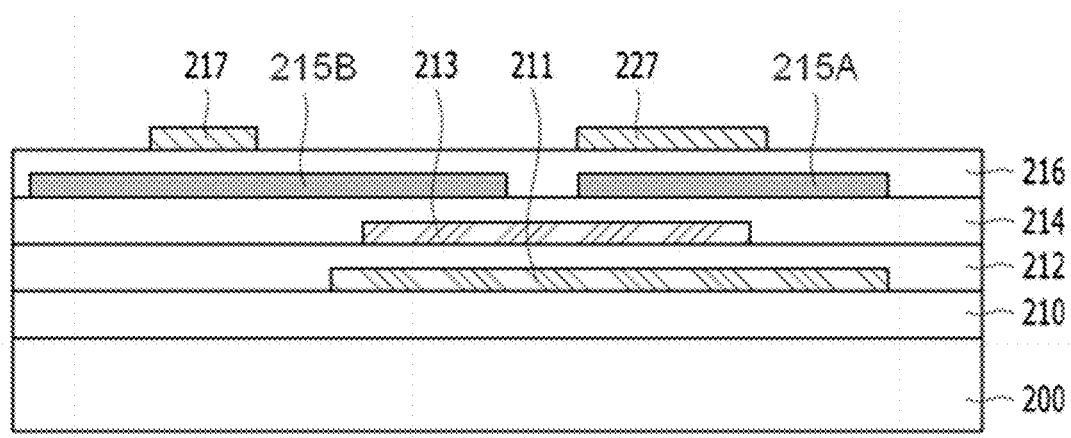

Subsequently, as shown in FIG. 9C, a second gate insulating film 216 is formed so as to cover the first and second active layers 215A and 215B.

Subsequently, a second gate electrode 217, which overlaps the second active layer 115B, and a first gate auxiliary electrode 227, which overlaps the first active layer 115A and protrudes further than the first gate electrode 213, are formed on the second gate insulating film 216.

Figure 9D:
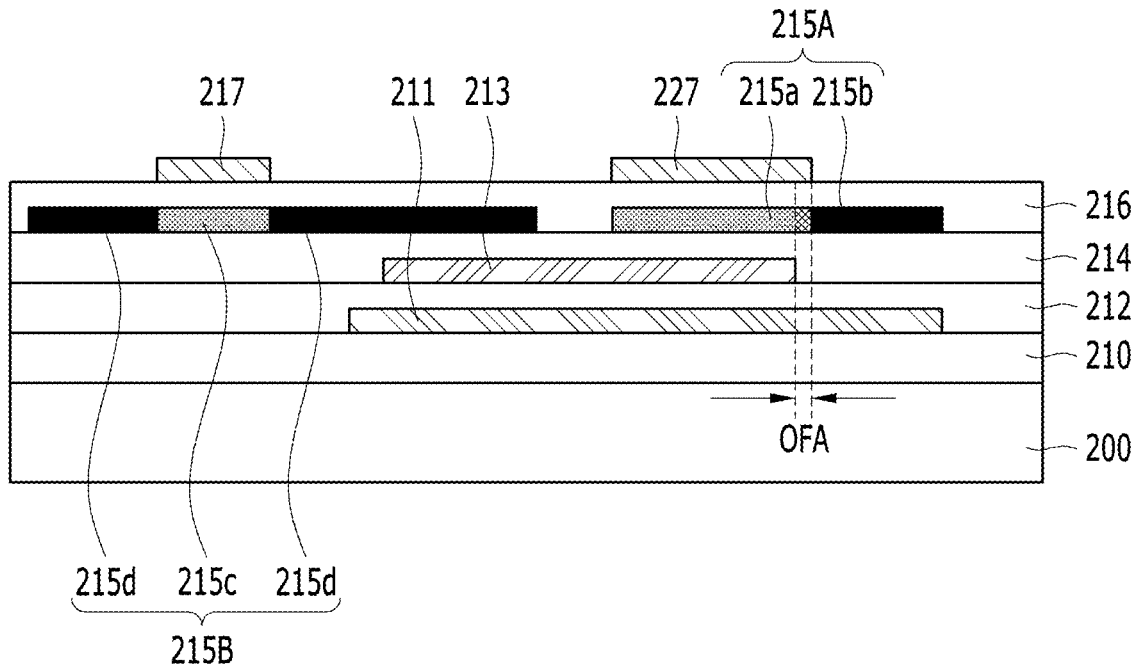

Subsequently, as shown in FIG. 9D, the first active layer 215A and the second active layer 215B are doped with a p+ type dopant using the second gate electrode 217 and the first gate auxiliary electrode 227 as masks to form a first doped area 215$b$ and a second doped area 215$d$ in the first active layer 215A and the second active layer 215B, respectively.

Here, undoped areas are intrinsic areas. Particularly, an area of the second active layer 215B that overlaps the second gate electrode 217 inside the second doped area 215$d$ is a second channel 215$c$, and an area of the first active layer 215A that overlaps the first gate electrode 213 is a first channel 215$a$. An area that directly abuts the first channel 215$a$ and is located between the first channel 215$a$ and the first doped area 215$b$, which is one of the intrinsic areas, is an offset area OFA, which is an element that has an increased S-Factor to thereby diversify the expression of gradation after a driving thin-film transistor Tdr is finally formed.

Figure 9E:
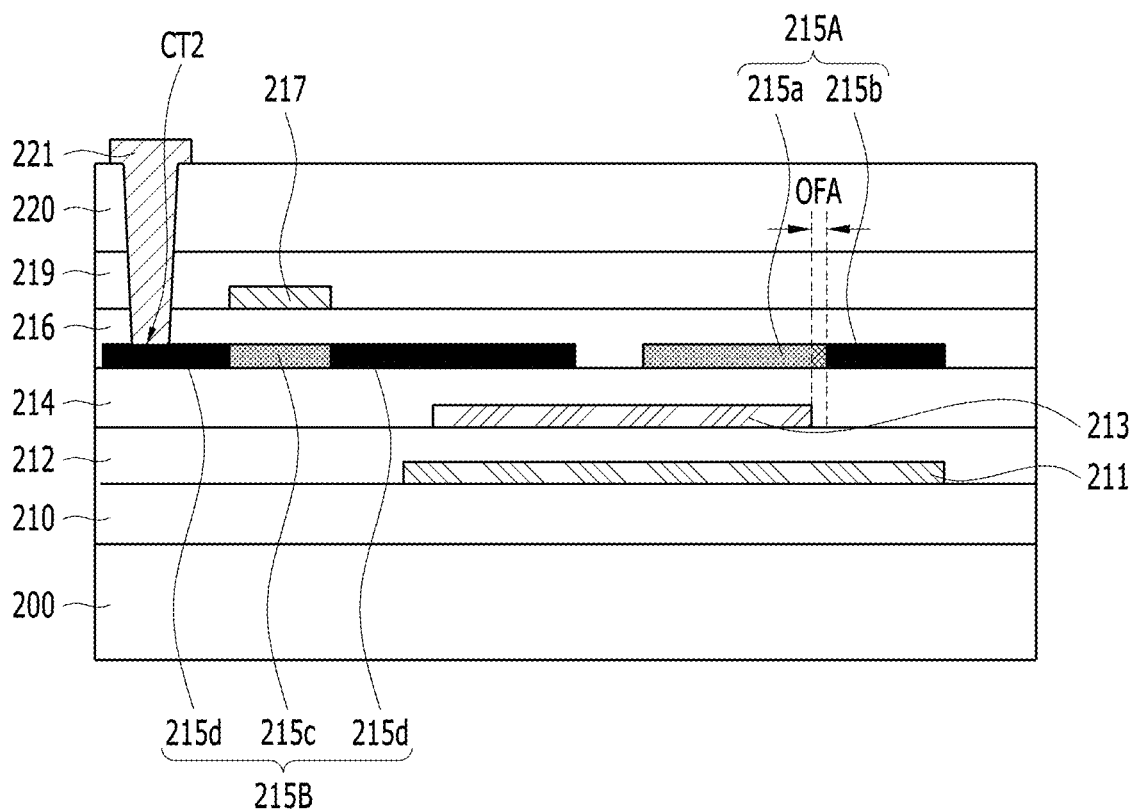

Subsequently, as shown in FIG. 9E, the first gate auxiliary electrode 227 is selectively removed.

Subsequently, a second interlayer insulating film 219 and a third interlayer insulating film 220 are successively formed by deposition so as to cover the second gate electrode 217. The third interlayer insulating film 220, the second interlayer insulating film 219, and the second gate insulating film 216 are removed to form a second contact hole CT2, through which a portion of the second doped area 215$d$ of the second active layer 215B is exposed.

Subsequently, a second drain electrode 221 connected to the second doped area 215$d$ of the second active layer 215B through the second contact hole CT2 is formed. A planar portion of the second drain electrode 221 is located on the third interlayer insulating film 220.

Figure 9F:
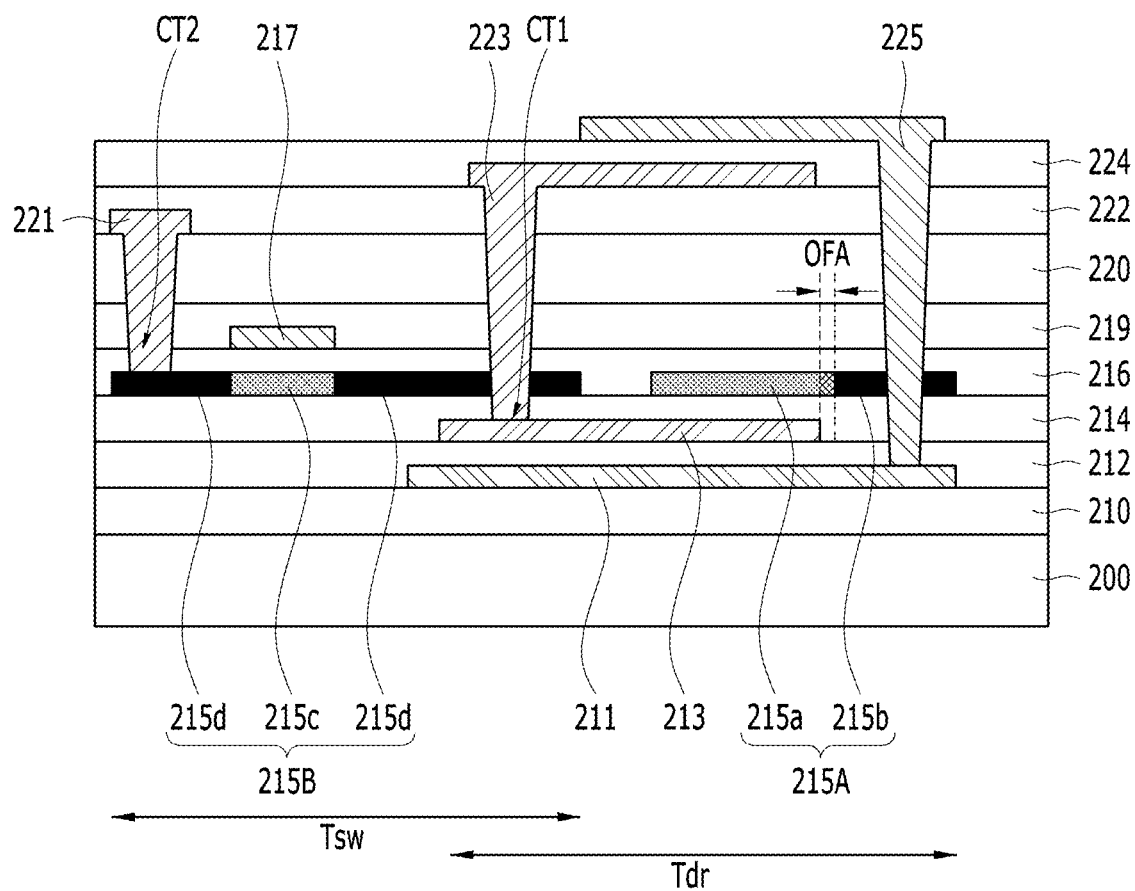

Subsequently, as shown in FIG. 9F, a fourth interlayer insulating film 222 is deposited on the third interlayer insulating film 220 including the second drain electrode 221. Then, the fourth interlayer insulating film 222, the third interlayer insulating film 220, the second interlayer insulating film 219, the second gate insulating film 216, a predetermined region of the second doped area 215$d$ of the second active layer 215B, and the first gate insulating film 214 are selectively removed to form a first contact hole CT1.

Subsequently, a second source electrode 223, which is connected to the first gate electrode 213 through the first contact hole CT1, is formed.

A planar portion of the second source electrode 223 is located on the fourth interlayer insulating film 222, and may have an area similar to that of the first gate electrode 213.

Subsequently, a fifth interlayer insulating film 224 is formed on the fourth interlayer insulating film 222 including the planar portion of the second source electrode 223. Then, the fifth interlayer insulating film 224, the fourth interlayer insulating film 222, the third interlayer insulating film 220, the second interlayer insulating film 219, the second gate insulating film 216, a predetermined region of the second doped area 215$d$ of the second active layer 215B, the first gate insulating film 214, and the first interlayer insulating film 212 are selectively removed to form a storage contact hole.

Subsequently, a storage contact electrode 225, which is connected to the first storage electrode 211 through the storage contact hole and partially overlaps the planar portion of the second source electrode 223 on the fifth interlayer insulating film 224, is formed.

The storage contact electrode 225 may serve as a first source electrode or a first drain electrode of the driving thin-film transistor Tdr.

Meanwhile, in the method of manufacturing the backplane substrate according to the third aspect of the present disclosure, the first gate auxiliary electrode 227 may not be removed but may remain, as described in the second aspect of the disclosure Hereinafter, an organic light-emitting display device including the above-described backplane substrate according to the present disclosure will be described.

Figure 10:
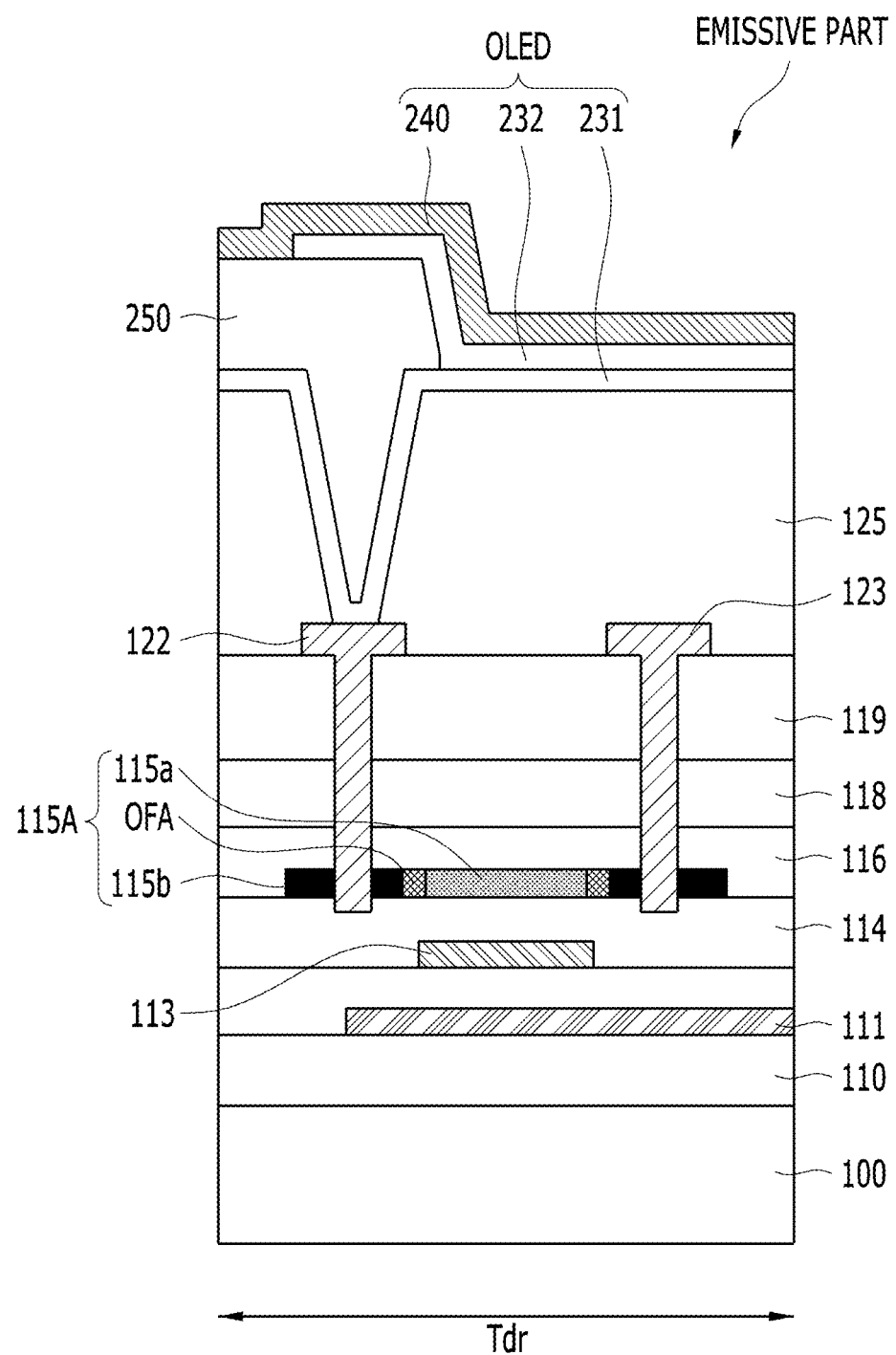
FIG. 10 is a cross-sectional view showing an organic light-emitting display device according to the present disclosure.

FIG. 10 is a cross-sectional view showing an organic light-emitting display device according to the present disclosure.

FIG. 10 is a cross-sectional view selectively showing only the connection between a driving thin-film transistor Tdr and an organic light-emitting diode OLED. The backplane substrate according to any one of the previous aspects may be provided under the organic light-emitting diode. In FIG. 10, the backplane substrate according to the first aspect is provided under the organic light-emitting diode. However, the present disclosure is not limited thereto. The backplane substrate according to any one of the second to fourth aspects may be provided under the organic light-emitting diode.

That is, a passivation film 125 is formed on the first source electrode 122 and the first drain electrode 123 of the driving thin-film transistor Tdr of the backplane substrate. The passivation film 125 is selectively removed to form a contact hole, through which a portion of the first source electrode 122 is exposed. A first electrode 231, which is connected to the first source electrode 122 through the contact hole, is formed, a bank 250 is formed so as to cover a non-emissive part, and an organic layer 232 including an organic emissive layer and a second electrode 240 are sequentially formed on the first electrode 231.

Here, the first electrode 231, the organic layer 232 including the organic emissive layer, and the second electrode 240 constitute an organic light-emitting diode OLED.

In the organic light-emitting display device according to the present disclosure, as shown in FIG. 3 to 6 or 10, overlapping between the channel of each thin-film transistor and the gate electrode is adjusted by changing the stack structure of the driving thin-film transistor and the switching thin-film transistor, whereby the offset area is selectively provided at the driving thin-film transistor. Consequently, the S-Factor of the driving thin-film transistor, which directly affects the expression of gradation, may be increased, whereby it is possible to sufficiently express gradation.

In addition, the thin-film transistor other than the driving thin-film transistor, e.g. the switching thin-film transistor, has high mobility and rapid response speed, unlike the driving thin-film transistor, whereby it is possible to sufficiently perform high-performance circuit operation in a high resolution or ultra-high resolution structure.

In addition, the driving thin-film transistor and the switching thin-film transistor are not connected to each other in a planar state but are vertically connected to each other such that the driving thin-film transistor and the switching thin-film transistor overlap each other in a planar state, whereby device integration is possible, which is advantageous in realizing ultra-high resolution.

As is apparent from the above description, the backplane substrate according to the present disclosure, the method of manufacturing the same, and the organic light-emitting display device using the same have the following effects.

First, overlapping between the channel of each thin-film transistor and the gate electrode is adjusted by changing the stack structure of the driving thin-film transistor and the switching thin-film transistor, whereby the offset area is selectively provided at the driving thin-film transistor. Consequently, the S-Factor of the driving thin-film transistor, which directly affects the expression of gradation, may be increased, whereby it is possible to sufficiently express gradation.

Second, the thin-film transistor other than the driving thin-film transistor, e.g. the switching thin-film transistor, has high mobility and rapid response speed, unlike the driving thin-film transistor, whereby it is possible to sufficiently perform high-performance circuit operation in a high resolution or ultra-high resolution structure.

Third, the driving thin-film transistor and the switching thin-film transistor are not connected to each other in a planar state but are vertically connected to each other such that the driving thin-film transistor and the switching thin-film transistor overlap each other in a planar state, whereby device integration is possible, which is advantageous in realizing ultra-high resolution.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. A backplane substrate comprising:
a substrate having a plurality of subpixels;
a driving thin-film transistor located at each subpixel and comprising a first gate electrode, a first active layer, a first source electrode and a first drain electrode connected to opposite sides of the first active layer, and a first gate insulating film disposed between the first active layer and the first gate electrode; and
a switching thin-film transistor electrically connected to the driving thin-film transistor at each subpixel and comprising a second gate electrode, a second active layer, a second source electrode and a second drain electrode connected to opposite sides of the second active layer, and a second gate insulating film disposed between the second active layer and the second gate electrode,
wherein the first active layer and the second active layer are located on a same layer,
the first gate electrode and the second gate electrode are located on different layers,
the first active layer has an offset area protruding from an edge of the first gate electrode by a predetermined width in a planar state and a first doped area is adjacent to the offset area, and the first gate electrode and the offset area do not overlap each other, and
wherein the first gate electrode overlaps the second active layer, and is connected to the second source electrode, and
wherein the second source electrode penetrates through the second active layer, and is connected to the first gate electrode in an overlapping region between the second active layer and the first gate electrode.

2. The backplane substrate according to claim 1, wherein the second active layer has a second doped area vertically aligned with an edge of the second gate electrode.

3. The backplane substrate according to claim 1, further comprising a first storage electrode that overlaps the first gate electrode.

4. The backplane substrate according to claim 3, wherein the first storage electrode and the first gate electrode constitute a storage capacitor.

5. The backplane substrate according to claim 2, wherein the first doped area and the second doped area are doped with a same dopant.

6. The backplane substrate according to claim 1, further comprising a first gate auxiliary electrode that overlaps the offset area on a same layer as the second gate electrode.

7. The backplane substrate according to claim 1, wherein the second source electrode, which is connected to the first gate electrode, has a planar portion on a layer different from a layer on which the second drain electrode is located.

8. The backplane substrate according to claim 7, wherein the second source electrode is connected to the first gate electrode through a first contact hole between the planar portion of the second source electrode and the first gate electrode, and the second drain electrode is extended to the second active layer through a second contact hole.

9. The backplane substrate according to claim 8, wherein the first contact hole has a larger depth than the second contact hole between an upper surface of the second drain electrode and the second active layer.

10. The backplane substrate according to claim 8, further comprising a first storage auxiliary electrode that is connected to the first storage electrode and overlaps the planar portion of the second source electrode.

11. The backplane substrate according to claim 1, wherein the first and second active layers are formed of polysilicon.

12. The backplane substrate according to claim 1, wherein the first active layer has a first channel that overlaps the first gate electrode, and the second active layer has a second channel that overlaps the second gate electrode.

13. The backplane substrate according to claim 1, wherein the offset area increases a period from an off state of the driving thin-film transistor.

14. The backplane substrate according to claim 1, wherein the offset area increases a diversity of gradation.

15. The backplane substrate according to claim 1, wherein the offset area is an intrinsic area.

16. The backplane substrate according to claim 1, wherein the offset area and the first doped area do not overlap the first gate electrode.

17. The backplane substrate according to claim 1, wherein the first active layer further includes a first undoped area adjacent to the offset area.

18. The backplane substrate according to claim 17, wherein the offset area is disposed between the first undoped area and the first doped area, and the offset area is on the same layer as the first undoped area and the first doped area.

19. The backplane substrate according to claim 17, wherein the first undoped area overlaps the first gate electrode.

20. An organic light-emitting display device having a backplane substrate comprising:
- a substrate having a plurality of subpixels;
- a driving thin-film transistor located at each subpixel and comprising a first gate electrode, a first active layer, a first source electrode and a first drain electrode connected to opposite sides of the first active layer, and a first gate insulating film disposed between the first active layer and the first gate electrode; and
- a switching thin-film transistor electrically connected to the driving thin-film transistor at each subpixel and comprising a second gate electrode, a second active layer, a second source electrode and a second drain electrode connected to opposite sides of the second active layer, and a second gate insulating film disposed between the second active layer and the second gate electrode, wherein the first active layer and the second active layer are located on a same layer, the first gate electrode and the second gate electrode are located on different layers, the first active layer has an offset area protruding from an edge of the first gate electrode by a predetermined width in a planar state, and a first doped area is adjacent to the offset area, and the first gate electrode and the offset area do not overlap each other, and wherein the first gate electrode overlaps the second active layer, and is connected to the second source electrode, and wherein the second source electrode penetrates through the second active layer, and is connected to the first gate electrode in an overlapping region between the second active layer and the first gate electrode; and an organic light-emitting diode comprising a first electrode connected to the first source electrode, an organic emissive layer located on the first electrode, and a second electrode located on the organic emissive layer at each subpixel.

* * * * *